United States Patent [19]
Duttweiler et al.

[11] Patent Number: 4,731,834
[45] Date of Patent: Mar. 15, 1988

[54] ADAPTIVE FILTER INCLUDING SIGNAL PATH COMPENSATION

[75] Inventors: Donald L. Duttweiler, Rumson; John Hartung, Marlboro, both of N.J.

[73] Assignee: American Telephone and Telegraph Company, AT&T Bell Laboratories, Murray Hill, N.J.

[21] Appl. No.: 876,737

[22] Filed: Jun. 20, 1986

Related U.S. Application Data

[62] Division of Ser. No. 656,535, Oct. 1, 1984, abandoned.

[51] Int. Cl.[4] .............................................. H04B 3/23
[52] U.S. Cl. .................................... 379/410; 370/32.1
[58] Field of Search ................ 370/32.1, 32; 379/406, 379/407, 410, 411; 381/94; 364/724; 333/18, 28 R; 340/347 M

[56] References Cited

U.S. PATENT DOCUMENTS

| 3,499,999 | 3/1970 | Sondhi | 179/170.2 |
| 3,500,000 | 3/1970 | Kelly et al. | 179/170.2 |
| 3,678,504 | 7/1972 | Kaneko | 340/347 DA |
| 4,024,358 | 5/1977 | Virupaksha | 370/32.1 X |
| 4,464,746 | 8/1984 | Snijders et al. | 379/32.1 |
| 4,467,146 | 8/1984 | Lassaux | 379/407 X |
| 4,507,747 | 3/1985 | Houdard et al. | 370/32.1 X |

OTHER PUBLICATIONS

"Companded Pulse-Code Modulation Voice Codec Using Monolithic Weighted Capacitor Arrays", Paul Gray et al., IEEE Journal of Solid-State Circuits, Dec. 1975, pp. 497–498.
G. P. Eckley et al., "Digital Signal Solves Hybrid Balance Puzzle", Telephone Engineer & Management, Aug. 1, 1983, pp. 39–46.
D. L. Duttweiler, "Bell's Echo-Killer Chip", IEEE Spectrum, Oct. 1980, pp. 34–37.

Primary Examiner—Jin F. Ng
Assistant Examiner—R. Vaas
Attorney, Agent, or Firm—Thomas Stafford

[57] ABSTRACT

Impulse response estimation is improved in an adaptive filter by compensating digital signals incoming to the filter to include a nonlinearity substantially identical to a nonlinearity included in a return signal path to the filter.

8 Claims, 5 Drawing Figures

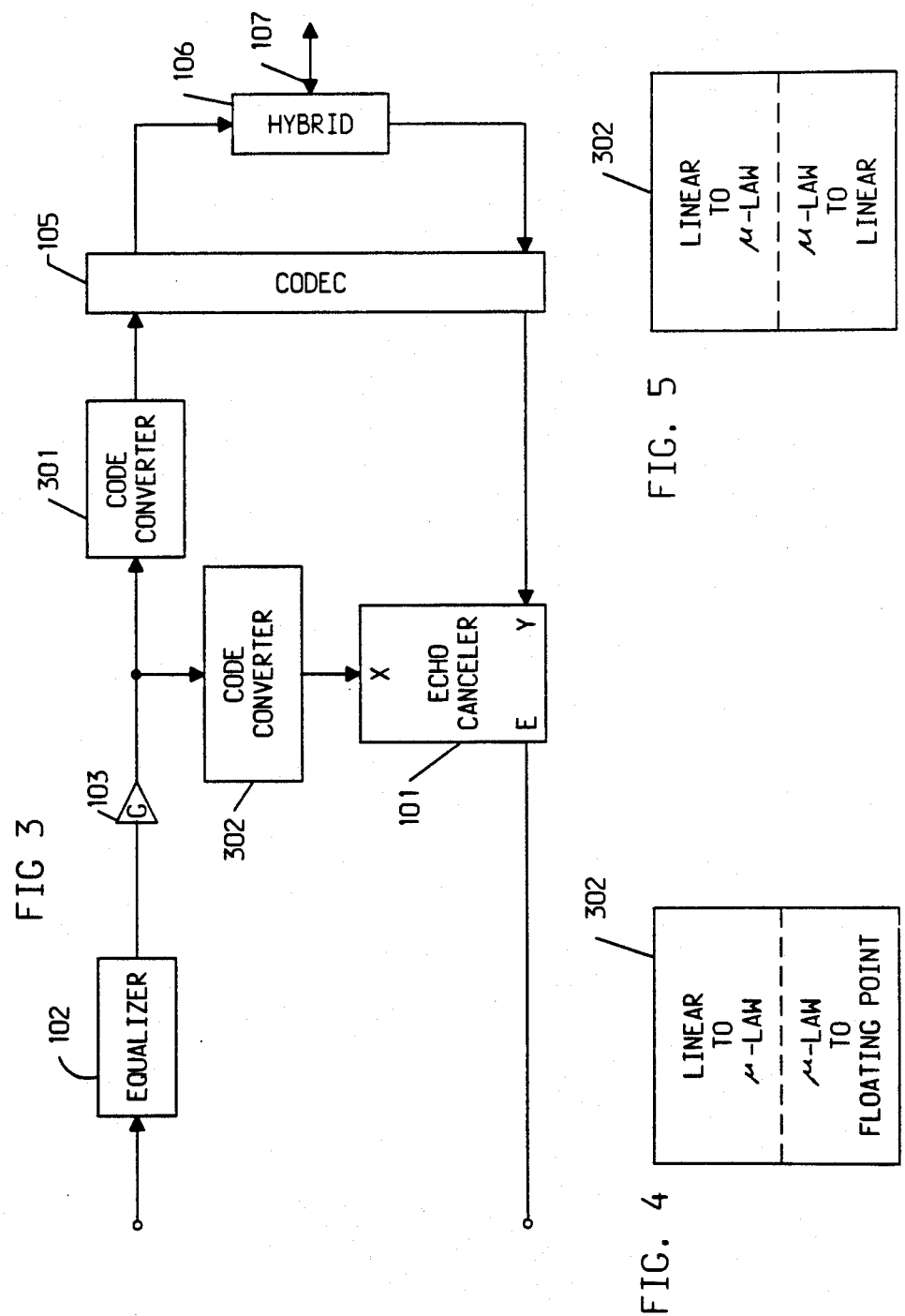

ADAPTIVE FILTER INCLUDING SIGNAL PATH COMPENSATION

This is a division, of application Ser. No. 656,535 filed Oct. 1, 1984, now abandoned in favor of Ser. No. 919,848.

TECHNICAL FIELD

This invention relates to adaptive filters and, more particularly, to echo cancelers.

BACKGROUND OF THE INVENTION

Adaptive filters, whether employed as echo cancelers or otherwise, may require encoded signals internally which are different from those used in a system in which the filter or echo canceler is to be employed. For example, the adaptive filter or echo canceler may use linear or floating point arithmetic to process signals while the system in which it is employed requires $\mu$-law PCM. That is to say, the adaptive filter or echo canceler may use signals encoded in a first digital code while the system uses signals encoded in a second digital code.

A typical prior art arrangement employing an adaptive transversal filter as an echo canceler is shown in FIG. 1. In this example, echo canceler 101 including an adaptive transversal filter uses linear arithmetic for processing incoming signals for estimating an impulse response to generate an estimate of an echo signal, while the system uses $\mu$-law PCM signals. Accordingly, a signal incoming to equalizer 102 is a linearly encoded digital signal having, for example, 20 bits. An output from equalizer 102 is supplied via gain unit 103 to the X input of echo canceler 101 and to linear-to-$\mu$-law converter 104. The $\mu$-law PCM signal is 8 bits. Consequently, a nonlinearity is introduced into the return signal path to echo canceler 101. A decoder in CODEC 105 converts the $\mu$-law PCM signal into analog form. The analog signal is supplied via hybrid 106 to bidirectional transmission path 107. An analog signal from bidirectional path 107 is supplied via hybrid 106 to a coder in CODEC 105 where it is converted to $\mu$-law PCM form. The $\mu$-law PCM signal including an echo signal developed in the return signal path from CODEC 105 is supplied to the Y input of echo canceler 101 where it is converted to linear form (a distortion-free conversion) and combined with the echo estimate signal. The combined signal is supplied from the E output of echo canceler 101 for transmission as desired. The so-called return signal path to echo canceler 101, in such an arrangement, includes converter 104, CODEC 105, hybrid 106 and bidirectional path 107.

We have determined that because of the nonlinearity introduced in the return signal path by the truncation of the linear encoded signal by the linear-to-$\mu$-law conversion, a "poor" impulse response estimate of the return signal path is obtained. Consequently, a "poor" estimate is obtained of the echo signal to be canceled. This is undesirable. Additionally, when such arrangements are used in voice frequency repeaters, singing, i.e., oscillating, in the repeater may occur and the poor impulse response estimate would slow any recovery from the oscillating condition.

SUMMARY OF THE INVENTION

Impulse response estimation is improved in an adaptive filter, in accordance with an aspect of the invention, by compensating digital signals incoming to the filter to include a nonlinearity substantially identical to a nonlinearity included in a return signal path to the filter.

In one example, a first digital code to second digital code converter is included in circuit relationship so that the signals supplied to the return signal path and to the adaptive filter experience the same nonlinearity. In one embodiment, a second digital code to first digital code converter is also included in the input circuit path to the adaptive filter.

In another example, a first digital code to second digital code converter is included in the return signal path and a code converter including first-to-second and second-to-first code conversions is included in the input circuit path to the adaptive filter.

In still another example, a first digital code to second digital code converter is included in the return signal path and a first-to-third digital code converter including first-to-second and second-to-third conversions is included in the input circuit path to the adaptive filter.

BRIEF DESCRIPTION OF THE DRAWING

The invention will be more fully understood from the following detailed description of illustrative embodiments thereof taken in connection with the appended figures, in which:

FIG. 3 shows in simplified block diagram form another adaptive filter employed as an echo canceler and including another embodiment of the invention;

FIG. 4 depicts in simplified block diagram form one code converter which may be used in the embodiment of FIG. 3; and FIG. 5 shows in simplified block diagram form another code converter which may be employed in the embodiment of FIG. 3.

DETAILED DESCRIPTION

Figure 2:
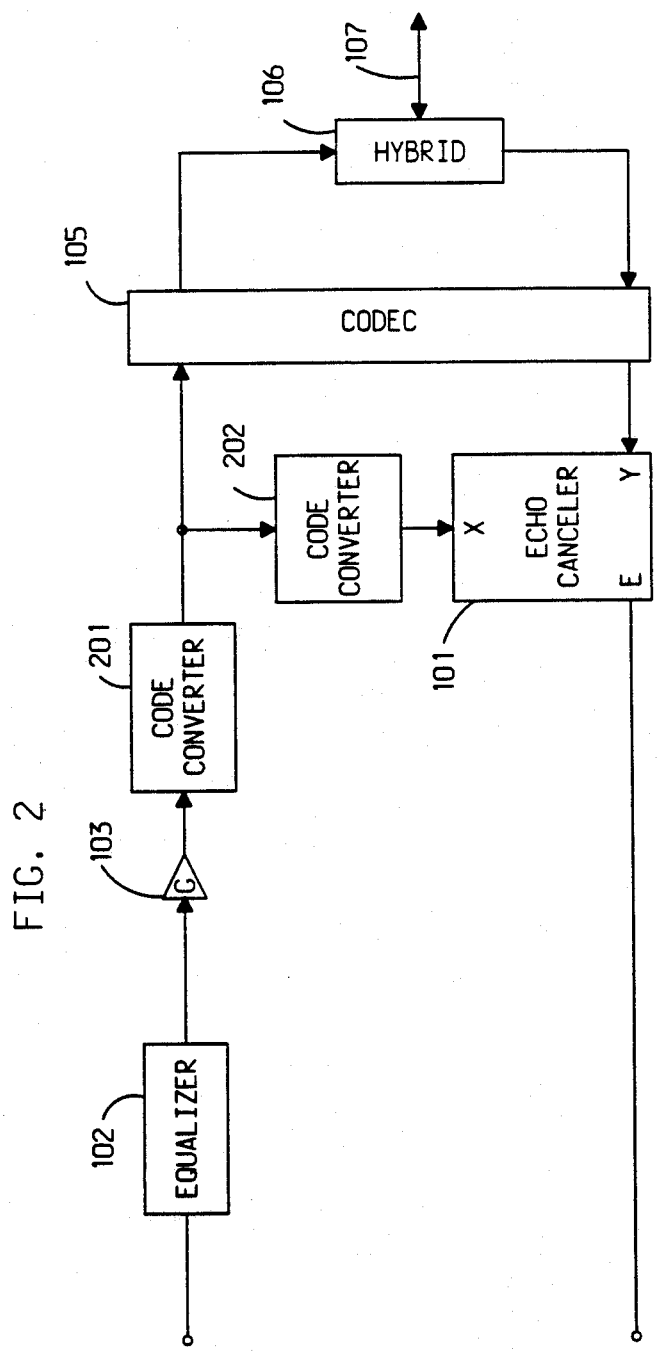
FIG. 2 depicts in simplified block diagram form an adaptive filter arrangement employed as an echo canceler and including an embodiment of the invention.

FIG. 2 shows in simplified block diagram form a transmission network including one embodiment of the invention. Specifically, the transmission network includes an adaptive filter employed as echo canceler 101. Echo canceler 101 including an adaptive transversal filter may be any of numerous ones known in the art. See, for example, our copending U.S. patent application Ser. No. 654,410, filed Sept. 26, 1984, now U.S. Pat. No. 4,591,669.

Accordingly, incoming signals which, in this example, are digital signals encoded in a first code are supplied to equalizer 102 and, in turn, via gain unit 103 to code converter 201. In this example, the first code signal is linear and includes 20 bits. Such signals are used in a digital signal processor implementation. Code converter 201 converts the digital signals from the first digital code to a second digital code, in well-known fashion. In this example, the second digital code is $\mu$-law PCM and includes 8 bit signals. As indicated above, it is important that the nonlinearity caused by converting the incoming signals from a first code to a second code be introduced to both the return signal path and to the input to echo canceler 101. This is realized, in accordance with an aspect of the invention, by connecting code converter 201 in circuit as shown so that the same second code signal is supplied to the circuit path to the X input of echo canceler 101 and to the return signal path. The return signal path includes CODEC 105, hybrid 106 and bidirectional transmission facility 107.

Since code converter 201 converts the linear code to μ-law PCM for transmission and linear signals are employed for processing incoming signals in echo canceler 101, code converter 202 is employed to reconvert the second code signals to the first code. Again, in this example, code converter 202 converts the μ-law PCM signals to linear 20 bit form. Since the linear signal input to echo canceler 101 is obtained from the same μ-law PCM signal supplied to the return signal path, it includes essentially the same nonlinearity as introduced to the return signal path. Consequently, echo canceler 101 generates an impulse response estimate and, hence, an echo signal estimate which matches the echo signal developed in the return signal path.

Figure 1:
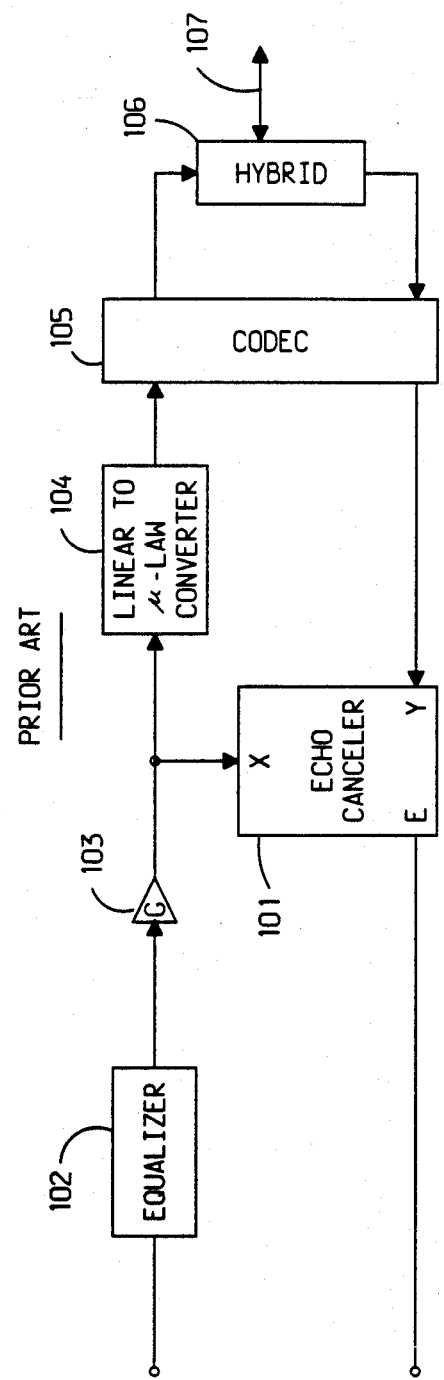
FIG. 1 shows in simplified block diagram form a prior adaptive filter arrangement including the problem which the invention overcomes.

As indicated above regarding FIG. 1, CODEC 105 includes a decoder for converting the output from converter 201 to analog form. The analog output from CODEC 105 is supplied via hybrid 106 to bidirectional transmission facility 107. Signals from transmission facility 107 are supplied via hybrid 106 to an encoder in CODEC 105 for conversion into the second digital code, namely, μ-law PCM. The digital signal output from CODEC 105 is converted to linear form and combined with the echo estimate signal in echo canceler 101 and supplied via output E for transmission or other use as desired.

FIG. 3 shows in simplified block diagram form a transmission network including another embodiment of the invention. The transmission network of FIG. 3 is similar to those shown in FIGS. 1 and 2. Consequently, elements of the network of FIG. 3 which are identical to those shown in FIGS. 1 and 2 have been similarly numbered. Accordingly, digital signals incoming to the transmission network are supplied via equalizer 102 and gain unit 103 to code converter 301 and code converter 302. Code converter 301 converts the digital incoming signals from a first code to a second code. In one example, the first code is linear and includes 20 bits per signal sample and the second code is μ-law PCM and includes 8 bits per signal sample. Thus, as in the other embodiment, converter 301 introduces a nonlinearity into the return signal path to echo canceler 101. A substantially identical nonlinearity is introduced, in accordance with an aspect of the invention, into the input of echo canceler 101 by code converter 302. This insures that echo canceler 101, and the adaptive filter therein, is processing a signal similar to the one transmitted through the return signal path in order to generate an echo estimate signal substantially equal to the echo signal from the return signal path.

In one example, code converter 302 converts the incoming signals from a first code to a third code. For example, from a linear code to floating point. FIG. 4 shows in simplified block diagram form one arrangement for converting from the first code to the third code which introduces a nonlinearity similar to that introduced to the return signal path by code converter 301. Accordingly, included in code converter 302 are a linear-to-μ-law PCM conversion and, then, a μ-law PCM-to-floating point conversion. In another example, code converter 302 converts from linear to linear. This arrangement is shown in simplified block diagram form in FIG. 5. Thus, in order to obtain a nonlinearity similar to that introduced in the return signal path by code converter 301, code converter 302 includes a linear-to-μ-law PCM conversion and a μ-law PCM-to-linear conversion.

The above arrangements are only examples of embodiments of the invention. It will be apparent to those skilled in the art that various changes in form and detail may be made without departing from the spirit and scope of the invention. Indeed, any number of digital codes may be employed, one being A-law PCM.

What is claimed is:

1. In combination:
an adaptive filter having first and second inputs and being adapted to be connected in circuit relationship with a transmission path;
first means having an input and an output for converting incoming digital signals supplied to said first means input from a first digital code to a second digital code, said digital signals in said second digital code being supplied from said output to said transmission path; and
second means having an input and an output for converting said incoming digital signals supplied to said second means input from said first code to said second code and from said second code to said first code and said second means output being connected in circuit relationship with said first input of said adaptive filt wherein a nonlinearity substantially identical to a nonlinearity introduced by said first means into signal being supplied by said transmission path to said second input of said adaptive filter is introduced by said second means into signals supplied to said first input of said adaptive filter.

2. The invention as defined in claim 1 wherein said first code digital signals have a predetermined number of bits which number is greater than a number of bits of said second code digital signals.

3. The invention as defined in claim 2 wherein said first code is linear and said second code is μ-law PCM.

4. The invention as defined in claim 3 wherein said adaptive filter comprises an adaptive transversal filter employed as an echo canceler and said transmission path includes a return signal path adapted to be connected in circuit relationship with said second input of said adaptive filter.

5. In combination:
an adaptive filter having first and second inputs and being adapted to be connected in circuit relationship with a transmission path;
first means having an input and an output for converting incoming digital signals supplied to said first means input from a first digital code to a second digital code, digital signals in said second digital code being supplied from said output to said transmission path; and
second means having an input and an output for converting said incoming digital signals supplied to said second means input from said first code to said second code and from said second code to a third digital code and said second means output being connected in circuit relationship to supply said third code signal to said adaptive filter first input, wherein a nonlinearity substantially identical to a nonlinearity introduced into signals supplied from said first measn by said transmission path to said second input of said adaptive filter is introduced into signals supplied by said second means to said first input of said adaptive filter.

6. The invention as defined in claim 5 wherein said first code digital signals have a predetermined number of bits which number is greater than a number of bits of said second code digital signals.

7. The invention as defined in claim 6 wherein said first code is linear, said second code is μ-law PCM and said third code is floating point.

8. The invention as defined in claim 7 wherein said adaptive filter comprises an adaptive transversal filter employed as an echo canceler and said transmission path includes a return signal path adapted to be connected in circuit relationship with said second input of said adaptive filter.

* * * * *